(12) United States Patent
Roziere et al.

(10) Patent No.: US 12,140,456 B2
(45) Date of Patent: Nov. 12, 2024

(54) METHOD AND DEVICE FOR DISCRIMINATORY CAPACITIVE DETECTION, AND APPARATUS PROVIDED WITH SUCH A DEVICE

(71) Applicant: FOGALE SENSORS, Nîmes (FR)

(72) Inventors: Didier Roziere, Nimes (FR); Christian Neel, Nimes (FR); Frédéric Ossart, Langlade (FR); Jérôme Porque, La Grande Motte (FR)

(73) Assignee: FOGALE SENSORS, Nîmes (FR)

( * ) Notice: Subject to any disclaimer, the term of this patent is extended or adjusted under 35 U.S.C. 154(b) by 362 days.

(21) Appl. No.: 17/419,633

(22) PCT Filed: Jan. 7, 2020

(86) PCT No.: PCT/EP2020/050161
§ 371 (c)(1),
(2) Date: Jun. 29, 2021

(87) PCT Pub. No.: WO2020/144151
PCT Pub. Date: Jul. 16, 2020

(65) Prior Publication Data
US 2022/0082412 A1    Mar. 17, 2022

(30) Foreign Application Priority Data
Jan. 10, 2019   (FR) ..................... 1900238

(51) Int. Cl.
*H03K 17/955* (2006.01)
*B25J 13/08* (2006.01)
*G01D 5/241* (2006.01)

(52) U.S. Cl.
CPC ............ *G01D 5/241* (2013.01); *B25J 13/086* (2013.01); *H03K 17/955* (2013.01)

(58) Field of Classification Search
CPC ........ B25J 13/086; B25J 19/027; F16P 3/148; G01B 7/023; G01D 5/241; H03K 17/955;
(Continued)

(56) References Cited

U.S. PATENT DOCUMENTS

2009/0079443 A1 * 3/2009 Ogata .................... G01V 3/088
324/671

FOREIGN PATENT DOCUMENTS

WO    WO-2018134081 A1 * 7/2018 ........... G01D 5/2405

OTHER PUBLICATIONS

International Search Report and Written Opinion received for PCT/EP2020/050161, mailed Mar. 27, 2020.
(Continued)

*Primary Examiner* — Alexander Satanovsky
*Assistant Examiner* — Brent J Andrews
(74) *Attorney, Agent, or Firm* — Greer, Burns & Crain, Ltd (57) ABSTRACT

A method for capacitive detection of nearby objects that may be located in the environment of an equipment provided with a capacitive detection device including a detection step, called discriminative detection step, including the following operations:
polarizing a first nearby object at a first alternating potential (V1), different from a ground potential (M), and from the potential of at least one second nearby object, at a first frequency (F1); and
determining a first discriminative signal representative of a capacitance, called electrode-object capacitance, seen by the at least one measurement electrode, at said first frequency (F1).

20 Claims, 4 Drawing Sheets

(58) Field of Classification Search
CPC ..... H03K 17/962; H03K 2217/960705; H03K 3/00; H03K 4/00; H03K 5/00; H03K 6/00; H03K 7/00; H03K 9/00; H03K 11/00; H03K 12/00; H03K 17/00; H03K 19/00; H03K 21/00; H03K 23/00; H03K 25/00; H03K 27/00; H03K 29/00; H03K 99/00; H03K 2217/00
See application file for complete search history.

(56) References Cited

OTHER PUBLICATIONS

French Search Report received for Application No. 1900238, dated Nov. 4, 2019.

* cited by examiner

METHOD AND DEVICE FOR DISCRIMINATORY CAPACITIVE DETECTION, AND APPARATUS PROVIDED WITH SUCH A DEVICE

BACKGROUND

The present invention relates to a method for discriminative capacitive detection of objects located in the environment of an equipment such as a robot equipped with a capacitive detection device. It also relates to a capacitive detection device implementing such a method and an equipment, in particular a robot, equipped with such a device.

The field of the invention is, non-limitatively, that of human-machine interaction devices, and in particular the field of industrial robotics or service robots, for example medical or domestic, or also collaborative robots, also called "cobots".

Equipments such as robots can be equipped with a device for capacitive detection of nearby objects, which can be fixed objects, mobile objects, living beings, and in particular an operator.

Such a capacitive detection device can comprise capacitive electrodes, called measurement electrodes, arranged in the form of sensitive surfaces which at least partially cover the surface of the equipment or of the robot, and detection electronics for polarizing the measurement electrodes and measuring a signal representative of a capacitance seen by the measurement electrodes. From the measured signal, it is possible to detect the presence and/or the contact of a nearby object.

However, the current capacitive detection devices, in particular equipping robots, are not able to discriminate a human operator from any other object. In general, these devices are not able to discriminate a first nearby object from a second nearby object, these objects being able to be located in the environment of an equipment or of a robot at the same moment or at different moments. It is thus not possible to adapt, or to customize, the behaviour of the equipment or of the robot in the event that a particular nearby object is detected.

A purpose of the present invention is to overcome these drawbacks.

Another purpose of the invention is to propose a discriminative capacitive detection of nearby objects, for an equipment such as a robot.

A purpose of the present invention is also to propose a method and a device for capacitive detection for an equipment such as a robot, making it possible to discriminate at least one nearby object from at least one other object, said nearby objects being able to be located in the environment of the equipment at the same moment or at different moments.

A purpose of the present invention is also to propose a method and a device for capacitive detection for an equipment such as a robot, making it possible to discriminate an operator from at least one other nearby object that may be located in the environment of the equipment at the same moment as the operator or at different moments.

SUMMARY

At least one of these purposes is achieved with a method for capacitive detection of nearby objects that may be located in the environment of an equipment equipped with a capacitive detection device comprising:

at least one capacitive electrode, called measurement electrode; and a detection electronics for polarizing the at least one measurement electrode at an electrical potential, and measuring at least one signal representative of a capacitance, called electrode-object capacitance, seen by said at least one measurement electrode;

characterized in that it comprises a step, called discriminative detection step, of selective detection of a nearby object (102, 104), comprising the following operations:

polarizing a first nearby object at a first alternating electrical potential, different from a ground potential, and different from an electrical potential of at least one second nearby object, at least at a first frequency; and determining a first discriminative signal representative of a capacitance, called electrode-object capacitance, seen by said at least one measurement electrode, at said first frequency.

The method according to the invention thus envisages polarizing a first nearby object at a first electrical potential that is different from the ground potential, and different from the potential of at least one second object, at least at a first frequency. Thus, it is possible to implement a capacitive detection operating at (or using) this first frequency which makes it possible to selectively detect one of the objects, and thus to discriminate the first object from the second object, regardless of the polarization potential of the measurement electrodes.

For example, if the measurement electrodes are polarized at the first potential, then the first object will be electrically invisible to the capacitive detection device equipping the equipment since it does not create a potential difference between this first object and the measurement electrodes. As the second object is polarized at a potential different from the first potential at the first frequency, a capacitance is established between this second object and the measurement electrodes, which is seen by the measurement electrodes at said first frequency: the second object will thus be able to be seen separately from the first object. In this case, measurement electrodes will be used to carry out "self-capacitance" detection and the first discriminative signal will be representative of the presence or absence of the second object only.

If, on the contrary, the measurement electrodes are polarized at a potential different from the first potential at least at the first frequency, then the first object will be selectively detected by the measurement electrodes at the first frequency, using said measurement electrodes as receiving electrodes, said first object being used as transmitting electrode. In this case, the measurement electrodes will be used in order to carry out "transmission" detection at the first frequency and the first discriminative signal will be representative of the presence or absence of the first object only.

Thus, the method according to the invention proposes capacitive detection making it possible to discriminate at least one nearby object from at least one other object that may be in the environment of an equipment, at the same moment or at different moments. Thus, the method according to the invention makes it possible to adapt, or even to customize, the behaviour of said equipment as a function of the object detected.

By "nearby object" is meant any fixed or mobile object, living or not, that may be located in the environment of an equipment, independent of said equipment. Such a nearby object does not form part of the equipment and does not participate in the operation of said equipment, nor in that of the capacitive detection device equipping this equipment. It can for example be an object located in the environment of the equipment, such as an operator or a person, a belt conveyor, a table or a working area, a truck, etc.

In the context of the present invention, an "equipment" can denote any type of device, system, appliance or sub-part of an appliance. It can denote for example:
- a board or a control interface, an instrument panel of a vehicle, a cockpit;
- an appliance or an industrial machine, such as a machine for machining, handling or packaging;
- a mobile system, such as a truck, a vehicle, an autonomous vehicle;
- a robot, in all its forms, such as a robotized system, a mobile robot, a vehicle on wheels or tracks such as a truck equipped with an arm or a handling system, or a robot of the humanoid, gynoid or android type, optionally provided with movement component parts such as limbs.

In particular, an equipment can be mobile when it is able to move or when it comprises moving parts.

In the present application, two alternating potentials are identical at a given frequency when they each comprise an alternating component that is identical at this frequency. Thus, at least one of the two potentials identical at said given frequency can also comprise a direct component, and/or an alternating component having a frequency different from said given frequency. Similarly, two alternating potentials are different at a given frequency when they do not comprise an alternating component that is identical at this frequency.

Two alternating components are identical when they have the same frequency, the same amplitude (for example plus or minus a few percentage points) and the same phase (for example plus or minus a few degrees). Two alternating components are different when they are not identical. They may be for example alternating components of different frequencies, or alternating components of the same frequency but out of phase, for example in quadrature.

The alternating potentials implemented in the context of the invention can of course be of any shape (sinusoidal, square, triangular, etc.).

In the present application, the term "ground potential" or "general ground potential" denotes a reference potential of the electronics, of the equipment or of its environment, which can be for example an electrical potential of a general ground of the electronics. This ground potential can correspond to an earth potential or to another potential, connected or not to the earth potential.

In general, in the present application, the electrical potentials are defined with respect to a common reference, which can be for example the ground of the electronics. In this case the ground potential corresponds for example to a zero value (0V).

Furthermore it is noted that generally, objects which are not in direct electrical contact with a particular electrical potential (electrically floating objects) tend to polarize by capacitive coupling at the electrical potential of other objects present in their environment, such as for example earth or electrodes, if the surface areas of overlap between these objects and those of the environment (or the electrodes) are sufficiently large.

Non-limitatively, determining the first discriminative signal at the first frequency can for example be carried out by implementing a synchronous demodulation of a measurement signal with a carrier signal at the first frequency, preferably identical to the first potential, or at least having the same phase.

With such synchronous demodulation, the selective detection can be carried out with a second nearby object polarized at an electrical potential which is different from the first alternating electrical potential in one of the following ways:
- it does not comprise a component at the first frequency;
- it comprises a component at the first frequency, but only in phase quadrature with the first potential at this first frequency. In this case, it is indeed possible to distinguish or select with the synchronous demodulation the in-phase and quadrature components of the global measurement signal.

Determining the first discriminative signal at the first frequency can also be carried out with an asynchronous demodulator, or envelope detection, with for example rectification of a band-pass filtered measurement signal around the first frequency, followed by low-pass filtering.

With such an envelope detection, the selective detection can be carried out with a second nearby object polarized at an electrical potential which differs from the first alternating electrical potential in that it does not comprise a component at the first frequency.

It should be noted that in all cases, for the selective detection step, the electrical potential of the second object must differ from the first alternating electrical potential in the sense that it does not comprise components that are indiscernible from the first alternating electrical potential for the detection electronics utilized.

The method according to the invention can comprise, during the discriminative detection step, polarizing at least one second object at the ground potential.

Alternatively or in addition, the method according to the invention can comprise, during the discriminative detection step, polarizing at least one second object at a second alternating potential at a second frequency different from the first frequency.

In this case, it is possible to carry out an individual detection of this second object, in a manner isolated from the other objects, by determining a second discriminative signal representative of the electrode-object capacitance seen by the at least one measurement electrode at this second frequency. In fact, in this case, the second discriminative signal will be representative of the presence or absence of the second object only, regardless the presence or absence of the first object (providing, of course, that the first alternating electrical potential does not comprise indiscernible components at the second frequency).

Non-limitatively, determining the second discriminative signal at the second frequency can for example be carried out by implementing a synchronous demodulation of a measurement signal with a carrier signal at the second frequency, or identical to the second potential at the second frequency.

Alternatively or in addition, the method according to the invention can comprise, during the discriminative detection step, polarizing at least one second object at a potential having the same frequency as the first alternating potential and orthogonal to said first alternating potential, at said first frequency.

The potentials are called orthogonal, or orthogonal in terms of the scalar product, when their scalar product, or the sum of the products of their successive temporal values, is zero, at least plus or minus the noise level.

These potentials can of course be of any waveform (sinusoidal, square, triangular, etc.).

Examples of orthogonal potentials comprise for example potentials having different frequencies (or fundamental frequencies) that are not multiples of one another, and potentials of one and the same frequency (or one and the same fundamental frequency) in phase quadrature.

Thus, in this case, each of the first and second objects are polarized at potentials comprising a component at the first frequency. However, these components are orthogonal to one another, so that they can be discriminated for the capacitive detection, in accordance with the definition given above. It is then possible to carry out a detection of each of the first and second objects, individually, during the discriminative detection step.

The potentials or their orthogonal components can be in phase quadrature. As described above, the capacitive detection can utilize synchronous demodulation with at least one carrier signal in phase with the first alternating potential to detect the corresponding component, and optionally also a carrier signal in quadrature with the first alternating potential to detect the orthogonal component.

When the discriminative detection step comprises an individual or selective detection of a first object and an individual or selective detection of a second object, these individual detections can be carried out:
  simultaneously or in turn, from one and the same measured signal; or
  in turn, from two sequentially measured signals.

According to an embodiment, during the discriminative detection step, the at least one measurement electrode can be polarized at the ground potential.

In this case, the capacitive detection is a transmission detection using the measurement electrode or electrodes as receiving electrodes, and the object(s) as transmitting electrode(s).

In this embodiment, it is possible to carry out an individual detection of the first object, but also of at least one second object, as described above, simultaneously or in turn.

Alternatively, the at least one measurement electrode can be polarized at a third alternating potential.

In this case, the potential of the at least one measurement electrode is thus different from the ground potential, and comprises at least one alternating component at at least one frequency.

According to a non-limitative embodiment of the method according to the invention, during the discriminative detection step, the third polarization potential can be:
  different from the first polarization potential at the first frequency, and
  if applicable, different from the second polarization potential at the second frequency.

In other words, as explained above, the third polarization potential does not comprise components that are indiscernible from the first and/or the second alternating electrical potential for the detection electronics utilized.

For example, with synchronous demodulation, it is possible to use a third orthogonal potential in terms of the scalar product at the first working potential, in particular at the first working frequency, and/or of a different frequency. With an envelope detection, it is possible to use a third potential having frequencies different from the first working frequency.

The same reasoning applies with the second working potential at the second frequency.

In this case, during the discriminative detection step, the at least one measurement electrode is used as receiving electrode in the context of transmission capacitive detection with detection:
  at the first frequency for the individual detection of the first object, and
  if applicable, at the second frequency for the individual detection of the second object;
simultaneously or in turn.

For example, the third potential may not comprise an alternating component at the first frequency, and if applicable, at the second frequency.

Alternatively, the third potential can be identical to the first potential at the first frequency, or at the second polarization potential at the second frequency.

For example, the third potential can be identical to the first potential at the first frequency. In this case, the first object becomes invisible and the second object generates a capacitance seen by the measurement electrodes in self-detection mode, at the first frequency.

Alternatively, the third potential can be identical to the second potential at the second frequency. In this case, the second object becomes invisible and the first object can be detected in transmission mode, at the first frequency.

The method according to the invention can also comprise a step, called common detection step, of detecting nearby objects, comprising the following operations:
  polarizing at least one measurement electrode at an alternating potential, called working potential, different from the ground potential, and different from the potentials of the first and second nearby objects at least at a frequency, called working frequency; and
  determining a common signal representative of a capacitance, called electrode-object capacitance, seen by the at least one measurement electrode, at said working frequency.

Thus, the common signal is representative of the capacitance due to the presence of the first object, or to the presence of the second object, or to the presence of these two objects, without being able to discriminate the object or objects present. In other words, the common signal is representative of the presence or absence of at least one of the objects without the possibility of discriminating said objects.

According to a particular non-limitative embodiment, during the common detection step:
  the working frequency can be identical to the first frequency, and the working potential can be identical, at this frequency, to the first polarization potential of a first object during the discriminative detection step, or
  if applicable, the working frequency can be identical to the second frequency and the working potential can be identical, at this frequency, to the second polarization potential of a second object;
the discriminative and common detection steps being carried out sequentially, said method comprising a step of modifying the potential of said first object, or of said second object, between said detection steps.

In this case, the discriminative detection and common detection steps are carried out in turn.

In addition, the discriminative detection step comprises measuring an electrical signal from which is determined the first discriminative detection signal, and the common detection step comprises another measurement of an electrical signal from which the common detection signal is determined.

According to another embodiment, the working potential used during the common detection step can be different:
  from the polarization potentials of the objects used during the discriminative detection step, at the first frequency; and
  if applicable, from the second potential at the second frequency.

In this case, the discriminative detection and common detection steps can be carried out simultaneously so that the common signal and the discriminative signal(s) are determined from one and the same measured signal. Thus, the method according to the invention makes it possible to carry out a more rapid detection, from one and the same measured signal.

Alternatively, in this embodiment, the discriminative detection and common detection steps can also be carried out sequentially from different measurement signals.

According to a first example of this embodiment, the working frequency can be the first frequency, but, at this frequency, the working potential can be orthogonal to each of the polarization potentials used to polarize the objects at this first frequency.

According to another example of this embodiment, the working frequency can be the second frequency, but, at this frequency, the working potential can be orthogonal to the second potential, and more generally to each of the polarization potentials used to polarize the objects at this second frequency.

According to yet another example, the working potential used during the common detection step can have a frequency different from the first frequency, and if applicable from the second frequency.

The method according to the invention thus envisages polarizing at least the first object at a potential different from a ground potential at the first frequency.

In order to do this, at least one nearby object can be polarized in a wired manner from a source supplying the capacitive detection device used in the method according to the invention.

Alternatively or in addition, at least one nearby object can be polarized by an electrical source independent of an electrical source supplying the detection device.

In this case, the method according to the invention can comprise exchanging, between said sources, a wireless signal for:
- synchronizing said sources with one another; or
- capturing the frequency, and/or the phase, of the polarization signal of said at least one nearby object.

Such a wireless signal can be exchanged by any wireless connection using any type of communication protocol.

For example, such a wireless signal can be exchanged by a Bluetooth, WiFi connection, or more generally by any radio connection.

Advantageously, at least one of the nearby objects can be a body or a part of a body of a human operator.

Thus, it is possible to detect the presence or absence of an operator independently of the presence or absence of another object.

It is then possible to envisage at the level of the equipment a specific behaviour in the case of detecting an operator, and a different behaviour in the case of detecting another object. In particular, it is possible to adopt a specific behaviour optimizing the safety of the operator since it is possible to detect the operator by discriminating him from another, and in particular from any other, nearby object.

According to an embodiment, the first object can be at least one part of a body of a human operator, and in particular a hand or an arm of said operator.

The human operator, or the part of the body of the human operator, can be polarized by one or more electrical contacts equipping at least:
- a wristband worn by the operator,
- an item of clothing worn by the operator,
- a shoe worn by the operator,
- etc.

Alternatively, the first object can also be a working area facing the equipment such as a table, a worktop, a belt conveyor, and the second object is at least one part of a body of a human operator.

The method according to the invention can also comprise a step of triggering:
- at least one first command, associated beforehand with the first object, in the case of detecting the first object during the discriminative detection step; and
- at least one second command, associated beforehand with the second object, different from said first command, in the case of detecting the second object during the discriminative detection step.

For example, when one of the objects is an operator, the command which is associated therewith can be an emergency procedure or stopping the equipment, when the latter is mobile or comprises mobile parts (such as a robot).

Still according to a non-limitative example, when one of the objects is an object other than an operator, the command which is associated therewith can be slowing or a change of trajectory of a mobile equipment or a mobile part of an equipment.

Of course, the method according to the invention can make it possible to selectively detect a plurality of first objects in the presence of one or a plurality of second objects. It is thus possible for example to apply respectively first alternating potentials different from one another to different first nearby objects, and to detect them selectively and individually according to the invention.

It is thus possible for example to polarize different operators at different first frequencies and to identify them. The first objects detected individually can also comprise operators and other elements of the environment, such as mobile elements, trucks, worktops, etc.

In addition, the second object can denote any element of the environment of the equipment or of the robot (ground, belt conveyor, operator, etc.) for example at the ground or the earth potential.

According to another aspect of the invention, a capacitive detection device for an equipment is proposed comprising:
- at least one capacitive electrode, called measurement electrode; and
- a detection electronics for polarizing at least one measurement electrode, and measuring at least one signal representative of a capacitance, called electrode-object capacitance, seen by said at least one measurement electrode; and
- a means for polarizing at least one nearby object;
arranged to implement all of the steps of the method according to the invention.

In particular, the capacitive detection electronics can be configured in order to implement individually, or in combination, each of the steps or operations described above with reference to the method according to the invention, and which are not repeated here for the sake of brevity.

The means for polarizing at least one nearby object can comprise at least one electrical contact conveying a polarization potential to said object, from an electrical source.

When the nearby object is a human body, or a part of a human body, the polarization means can comprise at least one electrical contact placed in at least:
- a wristband worn by the operator,
- a garment worn by the operator,
- a shoe worn by the operator,
- etc.

The device according to the invention can comprise a common electrical source for supplying the detection electronics and polarizing at least one nearby object.

In this case, said nearby object is connected to the detection electronics in a wired manner.

Alternatively or in addition, the device according to the invention can comprise:
- a first electrical source for polarizing the first object; and
- a second source for supplying the detection electronics, independent of said first source.

In this case, the first electrical source can be in communication, wired or wireless, with the detection electronics to transmit and/or receive, a synchronization signal of the polarization potential that it provides to the nearby object.

The signal exchanged can be used, on the side of the nearby object, to provide a correct polarization of the nearby object.

The signal exchanged can be used, on the side of the detection electronics, to determine a discriminative signal, and more particularly, to be used as, or to generate a carrier for synchronous demodulation of, a signal measured by the detection electronics during the discriminative detection phase.

According to an alternative embodiment, the device according to the invention can comprise a single electrical source for polarizing, in turn:
- at least one nearby object, and
- measurement electrodes;

said device also comprising means for connecting/disconnecting in turn said source to/from said nearby object and said measurement electrodes.

The connecting/disconnecting means can comprise controlled switches.

The switching can be carried out between a discriminative detection step during which the source polarizes a nearby object, and a common detection step during which the source polarizes the measurement electrodes.

The detection device can also comprise at least one guard electrode for electrically guarding the at least one measurement electrode.

In this case, the at least one guard electrode is polarized at the same potential as the measurement electrodes, or at the same potential as the measurement electrodes at the detection frequency, if applicable.

The detection electronics can be produced with analogue or digital components, or by a combination of analogue components and digital components.

According to an embodiment, the capacitive detection electronics can comprise a measuring stage comprising an operational amplifier (OA), or a circuit producing an operational amplifier, functioning as a transimpedance or charge amplifier, in which:
- a first input, for example an inverting input, is connected to one or more measurement electrodes, directly or via a polling means for example;
- a second, for example non-inverting, input, connected at the polarization potential of the measurement, and if applicable the guard, electrodes.

The output of the OA is looped on said first input via an impedance, and in particular via a capacitor.

In this configuration, the output of the OA supplies a voltage $V_S$, the amplitude of which is proportional to the electrode-object capacitance between at least one measurement electrode and the object.

The detection electronics can also comprise an oscillator supplying an alternating potential polarizing the measurement electrodes and if applicable the at least one guard electrode.

This polarization potential can comprise a sinusoidal or square signal, or any other waveform. The detection frequency can correspond to the fundamental frequency of this waveform.

The detection electronics can comprise at least one analysing stage for determining a detection signal, from the voltage $V_s$ supplied by the measuring stage, at a detection frequency, namely either the first frequency, or the second frequency, or the working frequency.

This analysing stage can comprise a demodulator (synchronous or asynchronous) at the detection frequency, or an amplitude detector, a calculation module, etc.

The detection electronics can comprise a single analysing stage used in turn to determine each detection signal, namely the first discriminative detection signal, if applicable the second discriminative detection signal, and the common detection signal.

Alternatively, the detection electronics can comprise several analysing stages, each dedicated to determining a detection signal, namely:
- a first analysing stage for determining the first discriminative detection signal,
- if applicable, a second analysing stage for determining the second discriminative detection signal, and
- a third analysing stage for determining the common detection signal.

The or each analysing stage can be an analogue or digital step, a physical stage or a software stage. In addition, these analysing stages can be arranged in series or in parallel.

According to another aspect of the same invention, an equipment equipped with capacitive detection device according to the invention is proposed.

According to non-limitative embodiments, the equipment can be of the robot type, or comprise any robotized system.

As explained above, it can in particular have the form of, or comprise, a robotized arm.

The robot can also be or comprise for example a mobile robot, a vehicle on wheels or tracks such as a truck equipped with an arm or a handling system, or a robot of the humanoid, gynoid or android type, optionally provided with movement component parts such as limbs.

BRIEF DESCRIPTION OF THE DRAWINGS

Other advantages and characteristics will become apparent on examination of the detailed description of non-limitative examples and from the attached drawings in which.

DETAILED DESCRIPTION

It is well understood that the embodiments that will be described hereinafter are in no way limitative. In particular, variants of the invention may be envisaged comprising only a selection of characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described may be combined together if there is no objection to such combination from a technical point of view.

In the figures, elements that are common to several figures retain the same reference.

Figure 1:
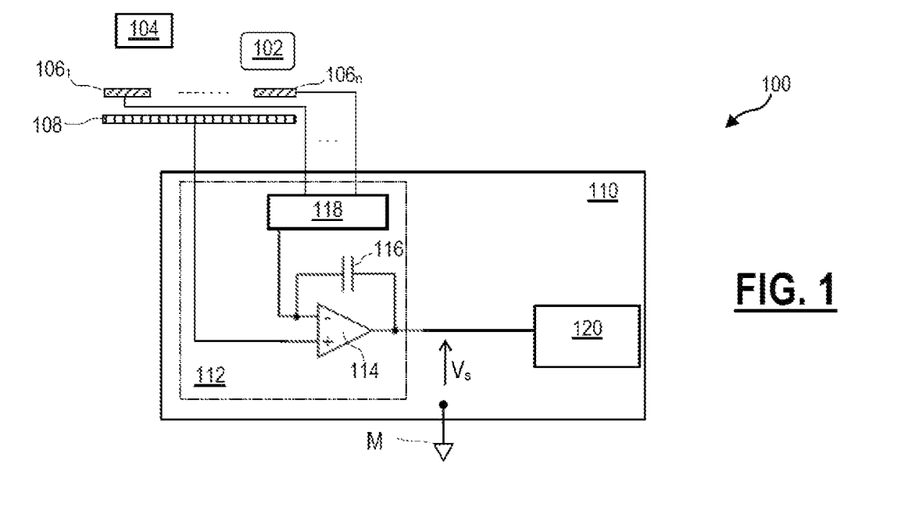
FIG. 1 is a diagrammatic representation of a non-limitative embodiment of a capacitive detection device that can be utilized in the present invention.

FIG. 1 is a diagrammatic representation of a non-limitative embodiment of a capacitive detection device that can be implemented in the context of the present invention.

The device 100, shown in FIG. 1, can be produced in an analogue or digital form, or a combination of analogue components and digital components.

FIG. 1 also shows a first nearby object 102 and a second nearby object 104 which the device 100 makes it possible to detect, and which do not form part of an equipment, such as a robot, equipped by the detection device 100.

In order to detect the nearby objects 102-104, the capacitive detection device 100 comprises several capacitive electrodes $106_1$-$106_n$, called measurement electrodes, making it possible to measure an electrical magnitude, and in particular a voltage, representative of a capacitance, called electrode-object capacitance, formed between on the one hand one or more of the measurement electrodes $106_1$-$106_n$ and on the other hand the object or objects 102 and 104. Hereinafter, the references 106 or $106_i$ can be used to denote the measurement electrodes.

The device 100 also optionally comprises at least one electrode 108, called guard electrode, for electrically guarding the measurement electrodes 106. To this end, this guard electrode 108 is set to the same electrical potential as the measurement electrodes 106, at least at the detection frequency of the electronics.

The detection device 100 also comprises detection electronics 110 for:
- polarizing at least one measurement electrode 106 at an electrical potential, which can be a ground potential or a potential different from the ground potential, such as an alternating potential, and
- measuring at least one signal representative of a capacitance, called electrode-object capacitance, seen by said at least one measurement electrode 106.

To this end, the detection electronics 110 comprises a measuring stage 112.

The measuring stage 112 comprises a current, or charge, amplifier represented by an operational amplifier (OA) 114 and a feedback capacitor 116 looping the output of the OA 114 at the inverting "−" input of the OA 114.

In addition, in the example shown, the non-inverting "+" input of the OA 112 receives the polarizing potential of the measurement electrodes 106 and of the guard electrode 108 and provision is made for the inverting "−" input of the OA 114 to be connected to each measurement electrode 106, via a polling means 118 so as to poll the measurement electrodes 106 individually in turn.

The polling means 118 is of course optional and can be for example a switch.

Under these conditions, the charge amplifier, and in particular the OA 114, supplies at the output a voltage $V_s$ at the detection frequency and of an amplitude proportional to the coupling capacitance $C_{eo}$, called electrode-object capacitance, between one or more measurement electrodes 106 connected at the "−" input thereof and the object or objects in proximity, or in contact, with said measurement electrode 106. The voltage $V_s$ is measured, in the example illustrated, with respect to a ground potential, referenced M.

In general, the measuring stage 112 can be analogue and/or digital (microprocessor) and comprise all necessary means for filtering, conversion, processing etc. The measuring stage 112 can also comprise components other than those described.

The detection electronics 100 can also comprise an analysing stage 120, provided to analyse the signal $V_s$ and to deduce therefrom a capacitive detection signal.

The analysing stage 120 can comprise:
- a demodulator (synchronous or asynchronous) for demodulating the signal provided by the measuring stage 112 at a detection frequency,
- an amplitude detector for measuring the amplitude of the signal provided by the demodulator; and
- a calculation module for providing a signal with respect to the presence, and/or the contact, of one or more nearby objects.

As explained previously, the demodulator can thus comprise a synchronous demodulator. In this case, the measurement signal originating from the measuring stage 112 is optionally band-pass filtered, then multiplied by a carrier signal at the detection frequency, preferably in phase with the measurement signal, then low-pass filtered to obtain an amplitude signal.

The demodulator can also comprise an asynchronous demodulator, or an envelope detection, with for example a rectification of the pass-band filtered measurement signal around the detection frequency followed by low-pass filtering.

The calculation module can be arranged to determine a distance or an item of distance information, and/or a contact or an item of contact information, between at least one measurement electrode 106 and at least one object. The calculation module can for example comprise or be produced in the form of a microcontroller, or an FPGA. The calculation module can also supply other items of information, such as triggering of alarms or safety procedures, when for example the measured distances are less than the predetermined distance thresholds.

In FIG. 1, only one analysing stage is shown. Of course, the detection electronics can comprise several analysing stages used simultaneously or in turn, for the same detection frequency or for different detection frequencies.

In general, the analysing stage 120 can be analogue and/or digital (microprocessor) and comprise all necessary means for filtering, conversion, processing etc. The analysing stage 120 can also comprise components other than those described.

The detection electronics 110, or at least its sensitive part with the charge amplifier can be referenced (or supplied by electric power supplies referenced) to one and the same potential as the guard electrode to minimize the parasitic capacitances, in particular when this potential is alternating and/or different from the ground potential M. The detection electronics 100 can also be referenced, more conventionally, to the ground potential M.

Figure 2A:
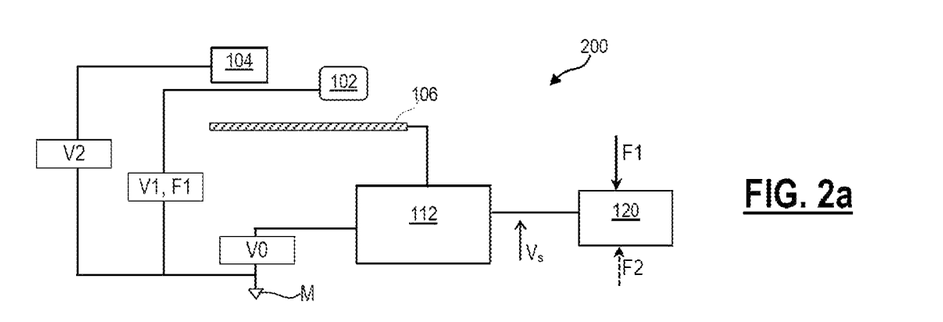
FIG. 2a is a diagrammatic representation of an example making it possible to carry out a discriminative capacitive detection step.
Figure 2B:
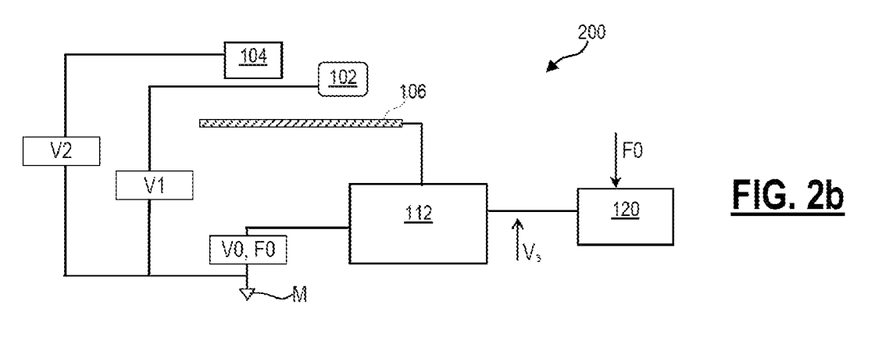
FIG. 2b is a diagrammatic representation of an example making it possible to carry out a common capacitive detection step.

FIGS. 2a and 2b are diagrammatic representations, in two configurations, of a general example for carrying out a discriminative capacitive detection step and a common capacitive detection step.

FIG. 2a shows the configuration carrying out the discriminative capacitive detection step and FIG. 2b shows the configuration carrying out the common detection step.

In the example 200 shown in FIGS. 2a and 2b:
the measurement electrode 106 is set at a potential V0,
the first nearby object 102 is set at an alternating potential V1 of frequency F1, and
the second nearby object 104 is set at a potential V2.

With reference to FIG. 2a, a step of discriminative detection of one of the nearby objects can be carried out at the frequency F1 that is non-zero, and provision is made for providing that the potentials V1 and V2 to be different at the frequency F1 and for the potential V1 to be different from the ground potential M.

According to a first case, if the potentials V1 and V0 are identical or substantially identical at the frequency F1, then V1 and V0 have (substantially) the same phase and the same amplitude at the frequency F1. In this case, the first object 102 will be at the same potential as the measurement electrode at the frequency F1. The capacitive detection at the frequency F1 will only detect the object 104 because the object 102 will be electrically invisible for the measurement electrode 106, because it is at the same potential. The capacitive detection will then be a self-capacitance capacitive detection.

According to a second case, if the potentials V1 and V0 are different at the frequency F1, then the capacitive detection at the frequency F1 will only detect the object 102, providing of course that the potential V0 and the potential V2 do not generate (at least significant) components measurable by the demodulator at the frequency F1, i.e. in particular, no components at the frequency F1, or, with a synchronous detector only, no component in phase with the potential V1 at the frequency F1. The capacitive detection will then be transmission capacitive detection, using the object 102 as transmitting electrode and the measurement electrode 106 as receiving electrode. In this case, the potential V0 can be equal to or different from the ground potential M. Moreover, the potential V2 can be equal to or different from the ground potential M, and/or equal to or different from the potential V0.

According to a third case, if the potential V1 is different from V0 at the frequency F1, and the potential V2 is an alternating potential at a frequency F2, also different from V0, then the capacitive detection at the frequency F1 will only detect the object 102. In addition, it will be possible to carry out a capacitive detection at the frequency F2 which will only detect the object 104. The capacitive detection will then be transmission capacitive detection, using the object 102 as transmitting electrode and the measurement electrode 106 as receiving electrode. This is possible with a synchronous or asynchronous demodulator, and different frequencies F1 and F2. This is also possible with a synchronous demodulator operating in phase and in quadrature, with a potential V2 of the same frequency but in phase quadrature with V1 at the frequency F1 (or F2).

With reference to FIG. 2b, by applying an alternating potential V0 of frequency F0 to the measurement electrode 106, all of the objects 102 and 104 can be detected, without discrimination, with demodulation at the frequency F0, while the potentials V0 and V1, respectively V0 and V2 are different from F0. As above, these conditions are met if the potentials V1 and V2 do not generate (at least significant) components measurable by the demodulator at the frequency F0, i.e. in particular, no components at the frequency F0, or, with a synchronous detector only, no component in phase with the potential V0 at the frequency F0.

In particular, it is possible to have the potentials V1 and V2 equal or substantially equal to the ground potential M for the common detection step.

The frequency F0 can be different from the frequency of V1 and V2, which makes it possible to implement the synchronous or asynchronous demodulations.

Alternatively, with synchronous demodulation, V0 can be of the same frequency as V1, respectively V2, but in phase quadrature with V1, respectively V2.

From the cases described above, it is possible to deduce that in the case where the potentials V1, V2 and V0 are all different, it is possible to carry out:
on the one hand, a step of discriminative detection of nearby objects individually detecting the object 102 with a demodulation at F1, and the object 104 with a demodulation at F2; and
on the other hand a step of common detection of the objects, detecting all of the objects present without discrimination, with a demodulation at F0.

In addition, these steps can be carried out simultaneously or in turn.

V0, V1 and V2 can be of different frequencies, with synchronous or asynchronous demodulation.

Alternatively, at least one of the potentials V0, V1 and V2 can be of the same frequency but in phase quadrature with at least one of the other potentials V0, V1 and V2, with synchronous demodulation.

Particular embodiment examples will now be described with reference to FIGS. 3a to 5b. In these Figures, and non-limitatively, it is considered that the first nearby object 102 is a hand of an operator and the second nearby object 104 is any other object that may be found in the environment of the equipment, which is in the illustrated case a robot, such as a table, a support, a worktop, another robot, etc.

Figure 3A:
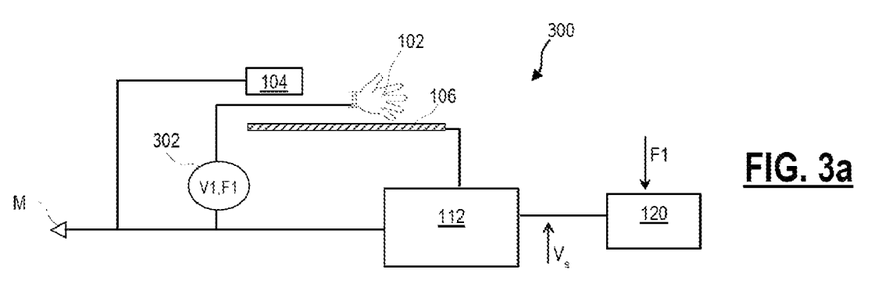
FIG. 3a is a diagrammatic representation of an example making it possible to carry out a discriminative capacitive detection step.

FIG. 3a is a diagrammatic representation of an embodiment example for carrying out a step of discriminative capacitive detection.

In particular, the example 300 shown in FIG. 3a makes it possible to carry out a discriminative capacitive detection of the hand 102 (which corresponds to the first nearby object 102).

To this end, the hand 102 is polarized at a potential V1, having frequency F1, different from the ground potential M, delivered by an electrical source 302.

The second object 104 and the capacitive electrode 106 are polarized at the ground potential M.

This example 300 makes it possible to carry out a discriminative capacitive detection step to detect, at the frequency F1, the presence or absence of the hand 102. The detection carried out is a transmission detection using the hand 102 as the transmitting electrode and the measurement electrode 106 as the receiving electrode.

This example 300 does not, however, make it possible to carry out a common capacitive detection step, namely a step of detecting, without discrimination, any one of the objects 102 and 104.

Figure 3B:
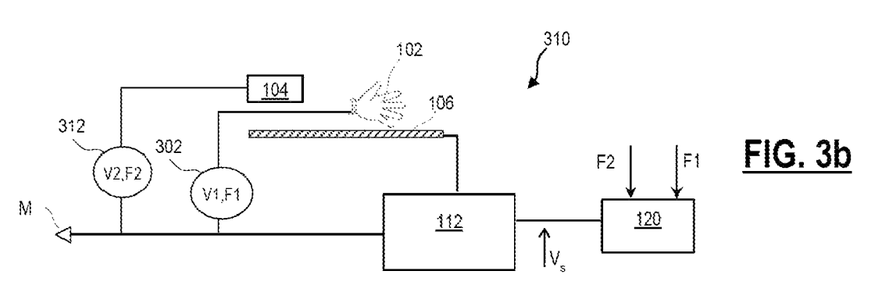
FIG. 3b is a diagrammatic representation of another example making it possible to carry out a discriminative capacitive detection step.

FIG. 3b is a diagrammatic representation of an embodiment example for carrying out a step of discriminative capacitive detection.

In particular, the example 310 shown in FIG. 3b, makes it possible to carry out a discriminative capacitive detection of the hand 102 (which corresponds to the first nearby object 102) and a discriminative detection of the second object 104.

To this end, the hand 102 is polarized at the potential V1, having frequency F1, different from the ground potential M, delivered by the electrical source 302, as in FIG. 3a.

The capacitive electrode 106 is polarized at the ground potential, also as in FIG. 3a.

With respect to the second object 104, it is polarized at a potential V2, having frequency F2, delivered by an electrical source 312, different from the ground potential M and the potential V1.

This example 310 makes it possible to carry out a discriminative capacitive detection step to detect, at the frequency F1, the presence or absence of the hand 102. The detection carried out at the frequency F1 is a transmission detection using the hand 102 as the transmitting electrode and the measurement electrode 106 as the receiving electrode.

In addition, this example 310 makes it possible to carry out a discriminative capacitive detection step to detect, at the frequency F2, the presence or absence of the second object 104. Detection carried out at the frequency F2 is a transmission detection using the second object 104 as the transmitting electrode and the measurement electrode 106 as the receiving electrode.

In the example 310 described in FIG. 3b, the same analysing stage 120 is used for the discriminative capacitive detection at the frequency F1 and the discriminative capacitive detection at the frequency F2. Alternatively, it is possible to use two analysing stages, one for the discriminative capacitive detection at F1 and the other for the discriminative capacitive detection at F2.

In addition, the discriminative capacitive detections at F1 and F2 can be carried out simultaneously or in sequence, in turn.

In order to carry out a discriminative detection with a synchronous or asynchronous demodulator, it is possible to use for example different frequencies F2 and F1. With a synchronous demodulator, it is also possible to use potentials V1 and V2 having one and the same frequency in phase quadrature.

It is to be noted that this example 310 also makes it possible to carry out a common capacitive detection step, namely a step of detecting, without discrimination, any one of the objects 102 and 104, by imposing potentials V1 and V2 that are identical or substantially identical at the frequency F1 (or F2). In this case, the steps of discriminative detections and of common detection are carried out sequentially, by changing the configuration of at least one electrical source 302, 312.

Figure 4:
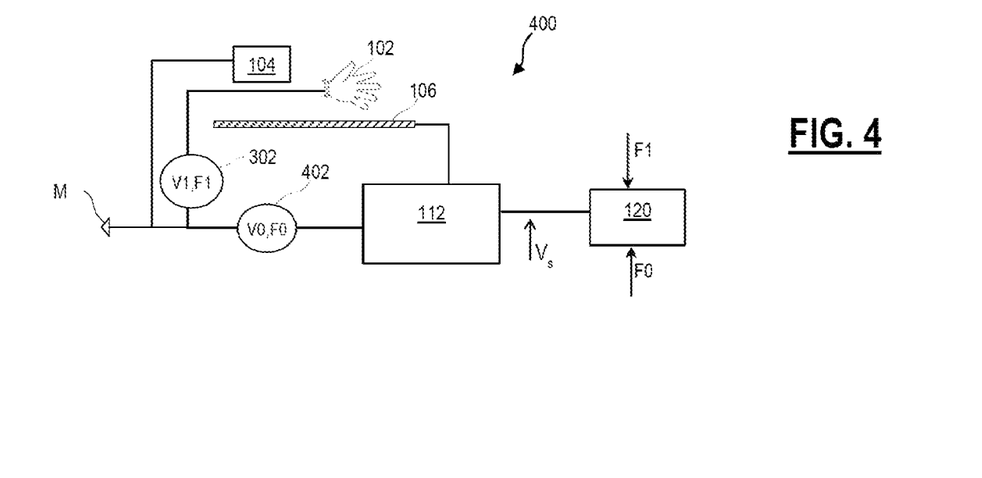
FIG. 4 is a diagrammatic representation of another example making it possible to carry out a discriminative capacitive detection step and a common detection step.

FIG. 4 is a diagrammatic representation of an embodiment example for carrying out a step of discriminative capacitive detection and a common detection step.

In particular, the example 400 shown in FIG. 4 makes it possible to carry out a discriminative capacitive detection of the hand 102 but also a common detection of all of the nearby objects without discrimination.

To this end, the hand 102 (which corresponds to the first nearby object) is polarized at a potential V1, having frequency F1, different from the ground potential M, delivered by an electrical source 302.

The second object 104 is polarized at the ground potential M.

With respect to the measurement electrode 106, it is polarized at a potential V0, having frequency F0, delivered by a source 402, different from the ground potential M and the potential V1.

This example 400 makes it possible to carry out a discriminative capacitive detection step to detect, at the frequency F1, the presence or absence of the hand 102. Detection carried out at the frequency F1 is a transmission detection using the hand as the transmitting electrode and the measurement electrode 106 as the receiving electrode.

In addition, this example 400 makes it possible to carry out a common detection step at F0, making it possible to detect the presence or absence of any nearby object without discrimination. Detection carried out at the frequency F0 is a self-capacitance detection because any nearby object, and in particular the objects 102 and 104, generate a capacitance seen by the measurement electrode 106 at the frequency F0.

As above, it is possible to use different frequencies F0 and F1. Alternatively, with a synchronous demodulator, it is possible to use potentials V0 and V1 having one and the same frequency (F0=F1) in phase quadrature.

In the example described in FIG. 4, the same analysing stage 120 is used for the discriminative capacitive detection at F1 and the common capacitive detection at F0. Alternatively, it is possible to use two analysing stages, one for the discriminative capacitive detection at F1 and the other for the common capacitive detection at F0.

In addition, in the example 400, the discriminative and common capacitive detection steps can be carried out simultaneously from a single measurement signal provided by the measurement step 112.

In the example described in FIG. 4, at least two electrical sources are used to carry out a discriminative capacitive detection step and a common capacitive detection step.

It is also possible to use a single electrical source to carry out these two capacitive detection steps, sequentially.

Figure 5A:
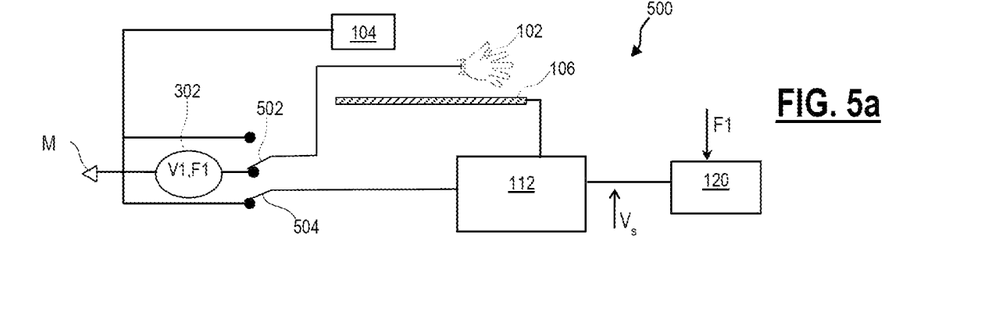
FIGS. 5a and 5b are diagrammatic representations in two configurations of an example making it possible to carry out a discriminative capacitive detection step and a common detection step, with a single electrical source.
Figure 5B:
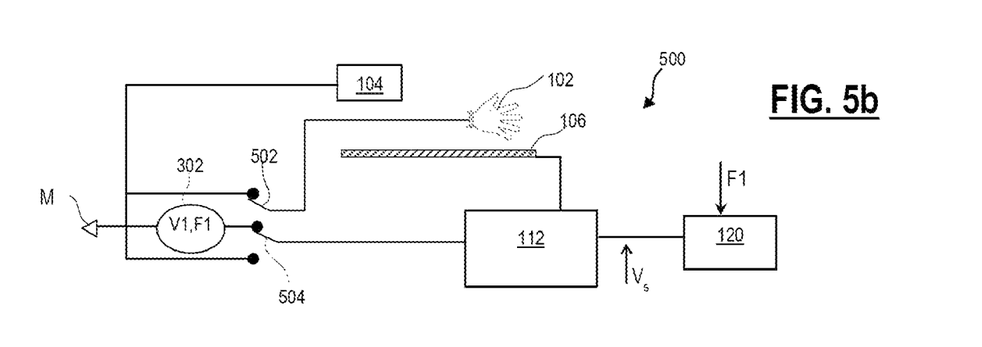

FIGS. 5a and 5b are diagrammatic representations in two configurations of an example making it possible to carry out a step of discriminative capacitive detection and a common detection step, with a single electrical source.

In particular, FIG. 5a represents the configuration making it possible to carry out a discriminative capacitive detection of the hand 102 individually, and FIG. 5b represents the configuration making it possible to carry out a common capacitive detection of any object without discrimination, including the hand 102.

In the example represented in FIGS. 5a and 5b, a single electrical source is used, namely the electrical source 302 delivering the alternating potential V1, at the frequency F1.

A first switch 502 is used to associate the hand 102, selectively either with the ground potential M, or with the potential V1 delivered by the source 302.

A second switch 504 is used to associate the measurement electrode 106, selectively either with the ground potential M, or with the potential V1 delivered by the source 302.

Regardless of the configuration, the second object 104 is polarized at the electrical ground potential M.

In the configuration shown in FIG. 5a, the hand is connected to the source 302 by the switch 502: the hand is thus polarized at the potential V1. At the same time, the measurement electrode 106 is connected to the ground potential M by the switch 504: the measurement electrode 106 is thus polarized at the ground potential M. This configuration makes it possible to carry out a discriminative capacitive detection step to detect, at the frequency F1, the presence or absence of the hand 102 individually. Detection carried out at the frequency F1 is a transmission detection using the hand 102 as the transmitting electrode and the measurement electrode 106 as the receiving electrode.

In the configuration shown in FIG. 5b, the hand is connected to the ground potential M by the switch 502: the hand 102 is thus polarized at the ground potential M. At the same time, the measurement electrode 106 is connected to the source 302 by the switch 504: the measurement electrode 106 is thus polarized at the potential V1. This configuration makes it possible to carry out a common capacitive detection step detecting the presence or absence of any nearby object, and in particular the presence of absence of the hand 102 and/or of the second object 104, both polarized at the ground potential M. The detection, carried out at the frequency F1, is a self-capacitance detection.

Other particular embodiment examples will now be described with reference to FIGS. 6 to 7b. In these Figures, and non-limitatively, it is considered that the second nearby object 104 is a hand of an operator and the first nearby object 102 is any other object that may be found in the environment of the equipment, which is in the illustrated case a robot, such as a table, a support, another robot, etc. In particular, the first object can be a worktop on which the robot carries out operations.

Figure 6:
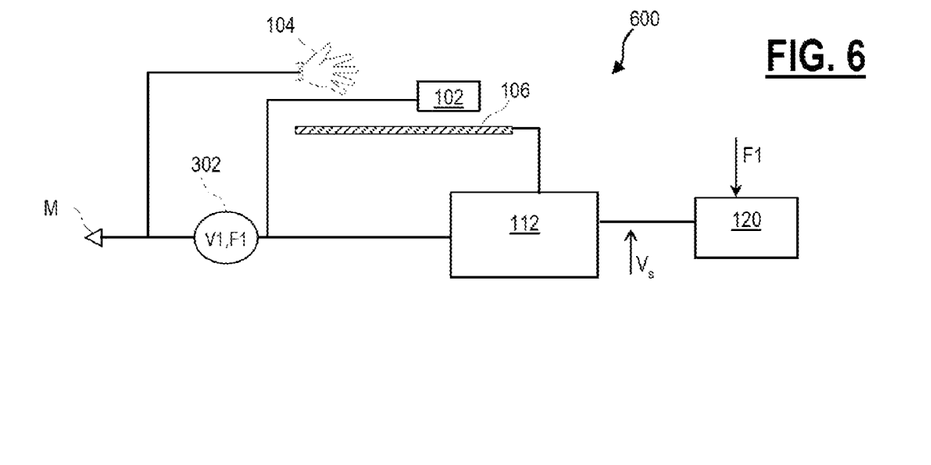
FIG. 6 is a diagrammatic representation of another example making it possible to carry out a discriminative capacitive detection step.

FIG. 6 is a diagrammatic representation of an embodiment example for carrying out a step of discriminative capacitive detection.

Example 600, shown in FIG. 6, makes it possible to carry out a discriminative capacitive detection of the hand 104 (which corresponds to the second nearby object).

To this end, the hand 104 is polarized at the ground potential M. The first object 102 and the capacitive electrode 106 are polarized at the potential V1, having frequency F1, different from the ground potential M at said frequency F1, delivered by the electrical source 302.

Under these conditions, the first object 102 is electrically invisible for the measurement electrode 106 because it is at the same potential as the measurement electrode 106.

This example 600 makes it possible to carry out a discriminative capacitive detection step to detect, at the frequency F1, the presence or absence of the hand 104 which, being at ground, modifies the capacitance seen by the measurement electrode 106. The detection carried out is a self-capacitance detection.

This example 600 does not, however, make it possible to carry out a common capacitive detection step.

Figure 7A:
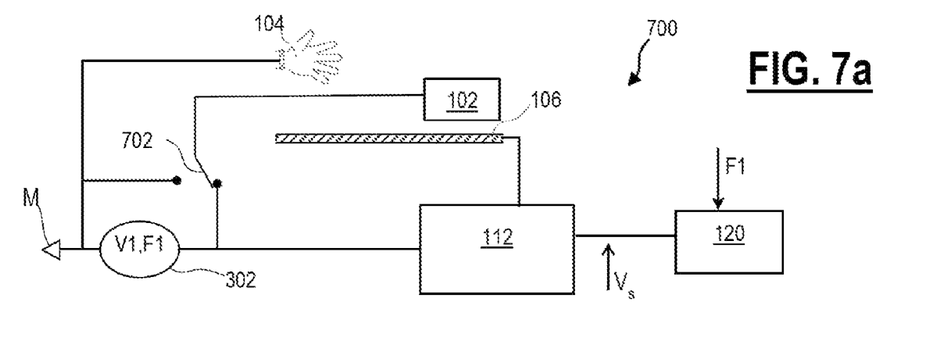
FIGS. 7a and 7b are diagrammatic representations in two configurations of another example making it possible to carry out a discriminative capacitive detection step and a common detection step, with a single electrical source.
Figure 7B:
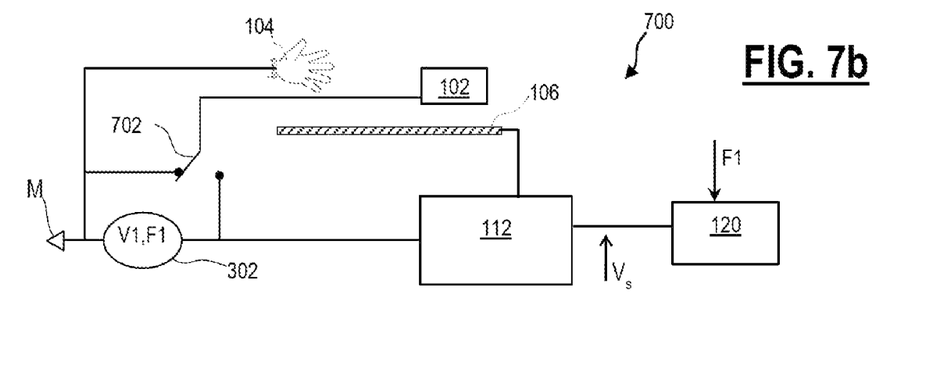

FIGS. 7a and 7b are diagrammatic representations in two configurations of an example making it possible to carry out a discriminative capacitive detection step and a common capacitive detection step, with a single electrical source.

In particular, FIG. 7a represents the configuration making it possible to carry out a discriminative capacitive detection of the hand 104 individually, and FIG. 7b represents the configuration making it possible to carry out a common capacitive detection of any object without discrimination, including the hand 104.

In the example represented in FIGS. 7a and 7b, a single electrical source is used, namely the electrical source 302 delivering the alternating potential V1, at the frequency F1.

Regardless of the configuration, the hand 104 (which corresponds to the second object 104) is polarized at the electrical ground potential M.

Regardless of the configuration, the measurement electrode 106 is polarized at the potential V1 delivered by the source 302.

A switch 702 is used to modify the polarization of the first object 102 between the configuration represented in FIG. 7a and the configuration represented in FIG. 7b. In particular, the switch 702 connects the first object, selectively either to the potential V1 delivered by the source 302 or to the ground potential M.

In the configuration shown in FIG. 7a, the first object 102 is connected to the source 302 by the switch 702: the first object 102 is thus polarized at the potential V1 like the measurement electrode 106. The first object is thus electrically invisible to the measurement electrode 106 at the frequency F1 of V1. This configuration makes it possible to carry out a discriminative capacitive detection step to detect, at the frequency F1, the presence or absence of the hand 104 individually. Detection carried out at the frequency F1 is a self-capacitance detection because the hand polarized at the ground potential M modifies the capacitance seen by the measurement electrode 106.

In the configuration shown in FIG. 7b, the first object is connected to the ground potential M by the switch 702: the first object 102 is thus polarized at the ground potential M like the hand 104. This configuration makes it possible to carry out, at the frequency F1, a common capacitive detection step detecting the presence or absence of any nearby object, in particular the presence of absence of the first object 102 and/or of the hand 104, both polarized at the ground potential M. The detection, carried out at the frequency F1, is a self-capacitance detection.

Of course, the invention is not limited to the examples which have just been described and numerous adjustments can be made to these examples without exceeding the scope of the invention.

The invention claimed is:

1. A method for capacitive detection of nearby objects that may be located in the environment of an equipment equipped with a capacitive detection device comprising:
    at least one capacitive electrode, called measurement electrode;
    at least one guard electrode for electrically guarding the at least one measurement electrode; and
    detection electronics for polarizing the at least one measurement electrode at an electrical potential, and measuring at least one signal (Vs) representative of a capacitance, called electrode-object capacitance, seen by said at least one measurement electrode;
    said method comprises a step, called discriminative detection step, of selective detection of a nearby object, comprising the following operations:
    polarizing a first nearby object at a first alternating electrical potential (V1), different from a ground potential (M), and different from an electrical potential of at least one second nearby object, at least at a first frequency (F1); and
    determining a first discriminative signal representative of a capacitance, called electrode-object capacitance, seen by said at least one measurement electrode, at said first frequency (F1), wherein the at least one guard electrode is polarized at the same electrical potential as the measurement electrode during the discriminative detection step.

2. The method according to claim 1, characterized in that it comprises, during the discriminative detection step, polarizing at least one second object at the ground potential (M).

3. The method according to claim 1, characterized in that it comprises, during the discriminative detection step, polarizing at least one second object at a second alternating potential (V2) at a second frequency (F2) different from the first frequency (F1).

4. The method according to claim 1, characterized in that it comprises, during the discriminative detection step, polarizing at least one second object at a potential of the same frequency as the first alternating potential (V1) and orthogonal to said first alternating potential (V1), at the first frequency (F1).

5. The method according to claim 1, characterized in that, during the discriminative detection step, the at least one measurement electrode is polarized at the ground potential (M).

6. The method according to claim 1, characterized in that, during the discriminative detection step, the at least one measurement electrode is polarized at a third alternating potential.

7. The method according to claim 6, characterized in that, during the discriminative detection step, the third polarization potential (V0) is:
different from the first polarization potential (V1) at the first frequency (F1), and
if applicable, different from the second polarization potential (V2) at the second frequency (F1).

8. The method according to claim 6, characterized in that the third potential is identical to the first polarization potential (V1) at the first frequency (F1), or to the second polarization potential (V2) at the second frequency (F2).

9. The method according to claim 1, characterized in that it also comprises a step, called common detection step, of detection of the nearby objects, comprising the following operations:
polarizing at least one measurement electrode at an alternating potential, called working potential, different from a ground potential (M), and different from the potentials of the first and second nearby objects at a frequency, called working frequency; and
determining a common signal representative of a capacitance, called electrode-object capacitance, seen by the at least one measurement electrode, at said working frequency.

10. The method according to claim 9, characterized in that, during the common detection step:
the working frequency is identical to the first frequency (F1), and the working potential is identical, at this frequency (F1), to the first polarization potential (V1) of a first object during the discriminative detection step, or
if applicable, the working frequency is identical to the second frequency and the working potential is identical, at this frequency, to the second polarization potential (V2) of a second object; and
the steps of discriminative and common detection being carried out sequentially, said method comprising a step of modifying the potential of said first object, or of said second object, between said detection steps.

11. The method according to claim 9, characterized in that the working potential (V0) used during the common detection step, is different:
from the polarization potentials (V1, M) of the objects used during the discriminative detection step, at the first frequency (F1); and
if applicable, from the second potential at the second frequency;
the steps of discriminative detection and common detection being carried out simultaneously so that the common detection signal and the discriminative detection signal(s) are determined from one and the same measured signal.

12. The method according to claim 1, characterized in that at least one nearby object is polarized in a wired manner from an electrical source supplying the detection device.

13. The method according to claim 1, characterized in that at least one nearby object is polarized by an electrical source independent of an electrical source supplying the detection device, said method also comprising an exchange, between said sources, of a wireless signal for:
synchronizing said sources with one another; or
recovering the frequency, and/or the phase, of the polarization signal of said at least one nearby object.

14. The method according to claim 1, characterized in that the first object is at least one part of a body of a human operator, and in particular a hand or an arm of said operator.

15. The method according to claim 1, characterized in that the first object is a working area facing the equipment such as a table, a worktop, a belt conveyor, and the second object is at least one part of a body of a human operator.

16. A capacitive detection device for an equipment, comprising:
at least one capacitive electrode, called measurement electrode, and
a detection electronics for polarizing at least one measurement electrode, and measuring at least one signal representative of a capacitance, called electrode-object capacitance, seen by said at least one measurement electrode; and
a means for polarizing at least one nearby object;
arranged in order to implement all of the steps of the method according to claim 1.

17. The device according to claim 16, characterized in that it comprises:
a first electrical source for polarizing the first object; and
a second source for supplying the detection electronics, independent of said first source.

18. The device according to claim 16, characterized in that it comprises a single electrical source for polarizing, in turn:
at least one nearby object, and
measurement electrodes;
said device also comprising means for connecting/disconnecting said source in turn to/from said nearby object and said measurement electrodes.

19. An equipment equipped with a capacitive detection device according to claim 16.

20. The equipment according to claim 19, characterized in that it is of the robot type.

* * * * *